(12) United States Patent
Chang et al.

(10) Patent No.: US 9,875,892 B2
(45) Date of Patent: *Jan. 23, 2018

(54) METHOD OF FORMING A PHOTORESIST LAYER

(71) Applicant: Taiwan Semiconductor Manufacturing Company, Ltd., Hsin-Chu (TW)

(72) Inventors: Chun-Wei Chang, Tainan (TW); Chih-Chien Wang, Changhua (TW); Wang-Pen Mo, Pingtung (TW); Hung-Chang Hsieh, Hsin-Chu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,387

(22) Filed: May 8, 2015

(65) Prior Publication Data
US 2015/0243500 A1 Aug. 27, 2015

Related U.S. Application Data

(63) Continuation of application No. 13/602,465, filed on Sep. 4, 2012, now Pat. No. 9,028,915.

(51) Int. Cl.
| | | |
|---|---|---|
| B05D 3/12 | (2006.01) | |
| H01L 21/02 | (2006.01) | |
| H01L 21/027 | (2006.01) | |
| H01L 21/67 | (2006.01) | |
| B05D 1/00 | (2006.01) | |

(52) U.S. Cl.
CPC .... *H01L 21/02282* (2013.01); *H01L 21/0276* (2013.01); *H01L 21/6715* (2013.01); *B05D 1/005* (2013.01)

(58) Field of Classification Search
CPC ............... B05D 1/005; H01L 21/6715; H01L 21/02282; H01L 21/0276
USPC ........... 427/240, 425; 118/52, 320; 438/780, 438/782
See application file for complete search history.

(56) References Cited

U.S. PATENT DOCUMENTS

| | | | |
|---|---|---|---|
| 4,732,785 A * | 3/1988 | Brewer ................. | H01L 21/316 257/E21.271 |
| 7,199,062 B2 | 4/2007 | Wei | |
| 7,718,551 B2 | 5/2010 | Liu et al. | |
| 8,927,058 B2 | 1/2015 | Huang et al. | |

(Continued)

*Primary Examiner* — Kirsten Jolley
(74) *Attorney, Agent, or Firm* — Haynes and Boone, LLP

(57) ABSTRACT

A method for forming a photoresist layer on a semiconductor device is disclosed. An exemplary includes providing a wafer. The method further includes spinning the wafer during a first cycle at a first speed, while a pre-wet material is dispensed over the wafer and spinning the wafer during the first cycle at a second speed, while the pre-wet material continues to be dispensed over the wafer. The method further includes spinning the wafer during a second cycle at the first speed, while the pre-wet material continues to be dispensed over the wafer and spinning the wafer during the second cycle at the second speed, while the pre-wet material continues to be dispensed over the wafer. The method further includes spinning the wafer at a third speed, while a photoresist material is dispensed over the wafer including the pre-wet material.

20 Claims, 8 Drawing Sheets

(56) References Cited

U.S. PATENT DOCUMENTS

| | | | |
|---|---|---|---|
| 2004/0180141 A1* | 9/2004 | Kobayashi | B05D 1/005 427/240 |
| 2009/0227120 A1 | 9/2009 | Liu et al. | |
| 2011/0052807 A1* | 3/2011 | Ichino | G03F 7/162 427/240 |
| 2013/0137034 A1 | 5/2013 | Fu et al. | |

* cited by examiner

METHOD OF FORMING A PHOTORESIST LAYER

CROSS-REFERENCE TO RELATED APPLICATION

The present application is a continuation of U.S. patent application Ser. No. 13/602,465, by inventors Chun-Wei Chang et al., entitled "A Method of Forming a Photoresist Layer," filed Mar. 21, 2012, issued as U.S. Pat. No. 9,028,915, which is hereby incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of multilayer integrated devices that have varying or high topography. For example, devices that have varying or high topography include field effect transistor (FET) devices and fin-like field effect transistor (Fin-FET) devices. The fabrication processes for forming FET and Fin-FET devices includes forming photoresist layers to define various device areas or regions. However, in certain situations, forming the photoresist layers has proved difficult. Accordingly, although existing methods of fabricating devices with varying or high topography have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
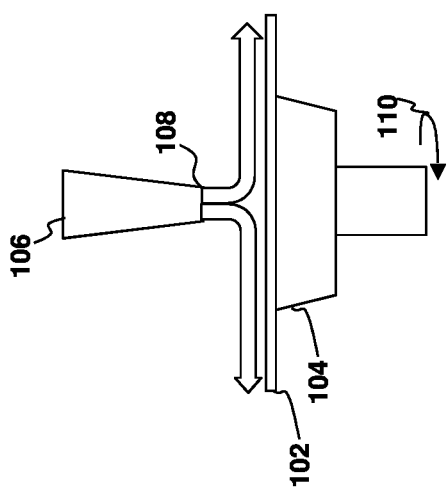
FIGS. 1A and 1B illustrate a diagrammatic top and side view of one embodiment of a wafer processing device including a wafer that is processed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern semiconductor manufacturing includes forming different types of integrated circuit devices, components, and features on a single wafer. For example, the different integrated circuit devices may include active and passive devices. These devices may include, for example, field effect transformers (FET) devices, fin-like field effect transformers (Fin-FET) devices, flash memory, resistors, capacitors, inductors, diodes, fuses, etc. The semiconductor devices may utilize an interconnect structure to perform electrical routing between the various integrated circuit devices, components, and features on the substrate and to establish electrical connections with external devices. The different types of devices generally have varying or high topography profiles which present specific challenges to the manufacturing processes.

A method of manufacturing, which address such challenges, is provided. Although various embodiments of the method provided may be employed during the manufacturing of the different type of devices disclosed above, it is understood that the invention should not be limited to a particular type of device, except as specifically claimed.

Figure 1A:
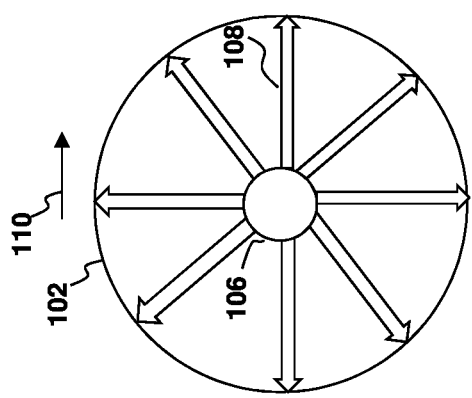

Referring to FIGS. 1A and 1B, illustrated is a diagrammatic top and side view of one embodiment of a wafer processing device 100 including a wafer 102 that is processed according to various aspects of the present disclosure described below. Wafer processing device 100 includes a lower support structure 104 operable to support and spin the wafer 102 and a dispense nozzle 106 operable to dispense pre-wet material 108, during a spin coating process. The pre-wet material 108 may be a material such as resist reducing consumption (RRC) material, such as propylene glycol monomethyl ether (PGME) or propylene glycol methyl ether acetate (PGMEA), that could dissolve photoresist so that it may be used to reduce photoresist or bottom antireflective coating (BARC) consumption while keeping good coating uniformity. Different types of photoresist may need different types of RRC materials.

The wafer 102 may be a 300 mm diameter wafer, a 450 mm diameter wafer, or any other suitable diameter wafer. The wafer 102 may include an elementary semiconductor material, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The wafer 102 may include different types of integrated circuit devices, components, and features formed thereon. For example, the different integrated circuit devices may include active and passive devices. These devices may include, for example, field effect transformers (FET) devices, fin-like field effect transformers (Fin-FET) devices, flash memory, resistors, capacitors, inductors, diodes, fuses, etc. The semiconductor devices may utilize an interconnect structure to perform electrical routing between the various integrated circuit devices, components, and features on the substrate and to establish electrical connections with external devices. The different types of devices may generally have varying or high topography profiles.

With further reference to FIGS. 1A, and 1B, during a spin coating process, the wafer processing device 100 is utilized to dispense a pre-wet material 108 from nozzle 106 onto a top surface of the wafer 102. As the wafer 102 is rotated at a speed (indicated by arrow 110) about the central axis, centrifugal forces induce a flow of the dispensed pre-wet material 108 away from a center portion of the wafer 102 and towards an outer edge of the wafer 102, thereby distributing the pre-wet material 108 across the top surface of the wafer 102.

Figure 2:
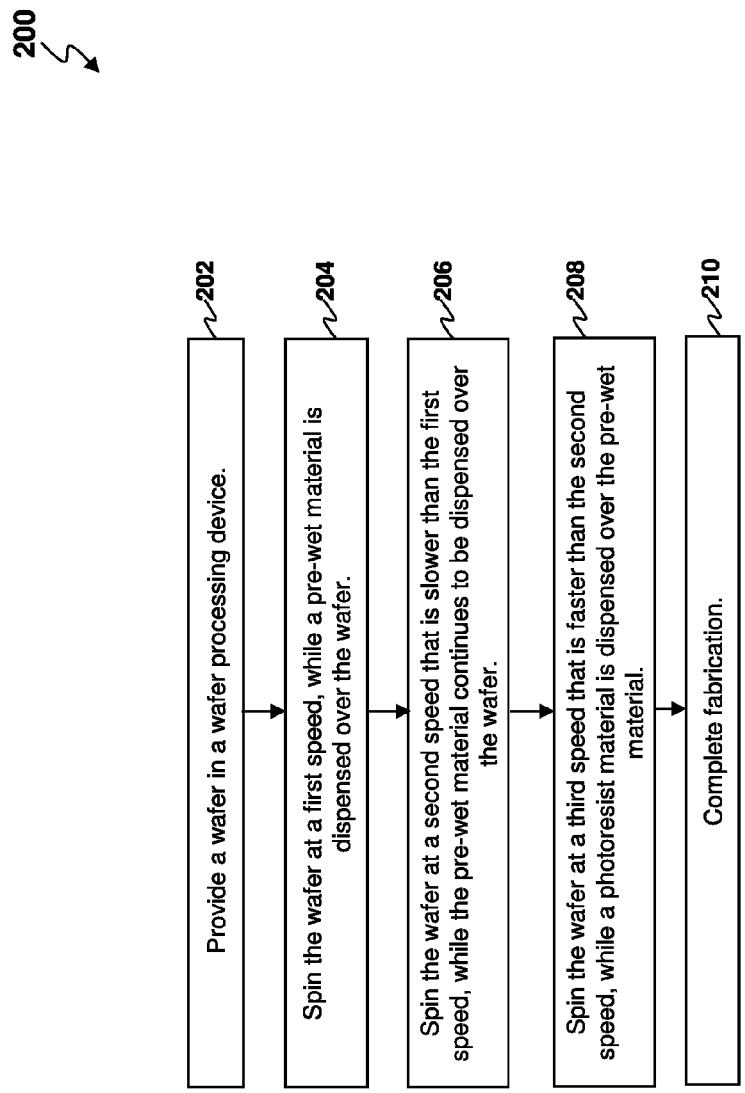
FIG. 2 is a flowchart illustrating a method of fabricating a semiconductor device according to various aspects of the present disclosure.

With reference to FIG. 2 a method 200 of fabricating a semiconductor device according to various aspects of the present disclosure is described below. In the present embodiment, the method 200 is for forming various layers when manufacturing an integrated circuit device. The method 200 begins at block 202 where a wafer is provided in a wafer processing device. The wafer processing device may be similar to the wafer processing device 100 of FIG. 1. The wafer may include different integrated circuit devices having varying or high topography profiles. At block 204, the wafer is spun at a first speed, while a pre-wet material is dispensed over the wafer. The method continues with block 206 where the wafer is spun at a second speed slower than the first speed, while the pre-wet material continues to be dispensed over the wafer. At block 208 the wafer is spun at a third speed that is faster than the second speed, while a photoresist material is dispensed over the pre-wet material. The method 200 continues with block 210 where fabrication of the integrated circuit device is completed. Additional steps can be provided before, during, and after the method 200, and some of the steps described can be replaced or eliminated for other embodiments of the method.

Figure 3:
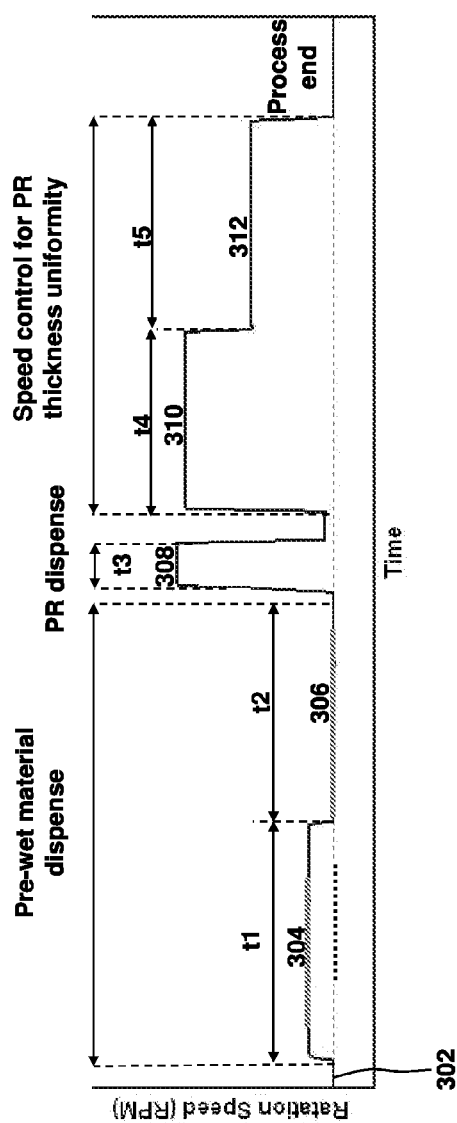
FIG. 3 illustrates a wafer processing timing diagram according to the method of FIG. 2.

FIG. 3 illustrates a wafer processing timing diagram 300 according to the method of FIG. 2. Referring to FIG. 3, line 302 illustrates the angular rotation speed of a wafer being processed in a wafer processing device (e.g., device of FIG. 1) in terms of revolution per minute (RPM), for explanation purposes. As illustrated by line 302, the wafer is spun to a first angular speed 304 and a pre-wet material, such as a reducing resist consumption (RRC) material, is dispensed. The first angular speed 304 may be any appropriate angular speed based on design requirements. For example, design requirements may increase or decrease the first angular speed 304 by based on various factors that affect micro-bubble formation, such as pre-wet material viscosity, temperature of the wafer, temperature of the pre-wet material, ambient temperature, and/or the occurrence of micro-bubbles (e.g., by increasing the angular speed, the occurrence of micro-bubbles may be decreased). In the present embodiment, for example, the first angular speed 304 is less than 600 RPMs, and in one example ranges from about 300 to about 600 RPMs. The first angular speed 304 may be maintained for a first period of time t1, which may be any appropriate period of time based on design requirements. In the present embodiment, for example, the first period of time t1 is less than about 6 seconds.

After the wafer has been spun up to the first angular speed 304 and the pre-wet material has been dispensed on the wafer for a first period of time, the wafer speed is reduced to a second angular speed 306. The second angular speed 306 may be any appropriate angular speed based on design requirements. In the present embodiment, for example, the second angular speed 306 is about zero. In alternative embodiments, the second angular speed 306 is greater than zero but less than the first angular speed 304. For example, the second angular speed 306 may be less than about 100 RPMs. In another example, the second angular speed 306 may range from about 0 RPMs to about 20 RPMs. The second angular speed 306 may be maintained for a second period of time t2 such that the pre-wet material may settle. In the present embodiment, the second period of time t2 is about 4 seconds.

Still referring to FIG. 3, after the pre-wet material has been dispensed, the wafer is accelerated to a third angular speed 308 for a third period of time t3 and a photoresist material is dispensed over the pre-wet material. Thereafter, the speed of the wafer, as illustrated by line 302, is modulated according to a predetermined speed profile to thereby control the thickness uniformity of the photoresist across the surface of the wafer. In the present embodiment, for example, the predetermined profile includes two different angular speeds/period of times (i.e., fourth angular speed 310 for a fourth period of time t4 and fifth angular speed 312 for a fifth period of time t5). The angular speeds 310, 312 may be any appropriate speed according to design requirements. The periods of time t4, t5 may be any appropriate speed according to design requirements. For example, in the present embodiment, the angular speeds 310, 312 are less than 1200, 600 RPMs, respectively, and the period of time t4, t5 are less than 20 seconds each. As another example, the angular speeds 310, 312 are less than 2000, 1000 RPMs, respectively, and the period of time t4, t5 are less than 60 seconds each. In alternative embodiments, the predetermined profile may include more than two different angular speeds with each angular speed being maintained for different or same periods of time. In alternative embodiments, prior to dispensing the photoresist material, a BARC material is dispensed after which the photoresist material is dispensed over the BARC material.

Figure 4:
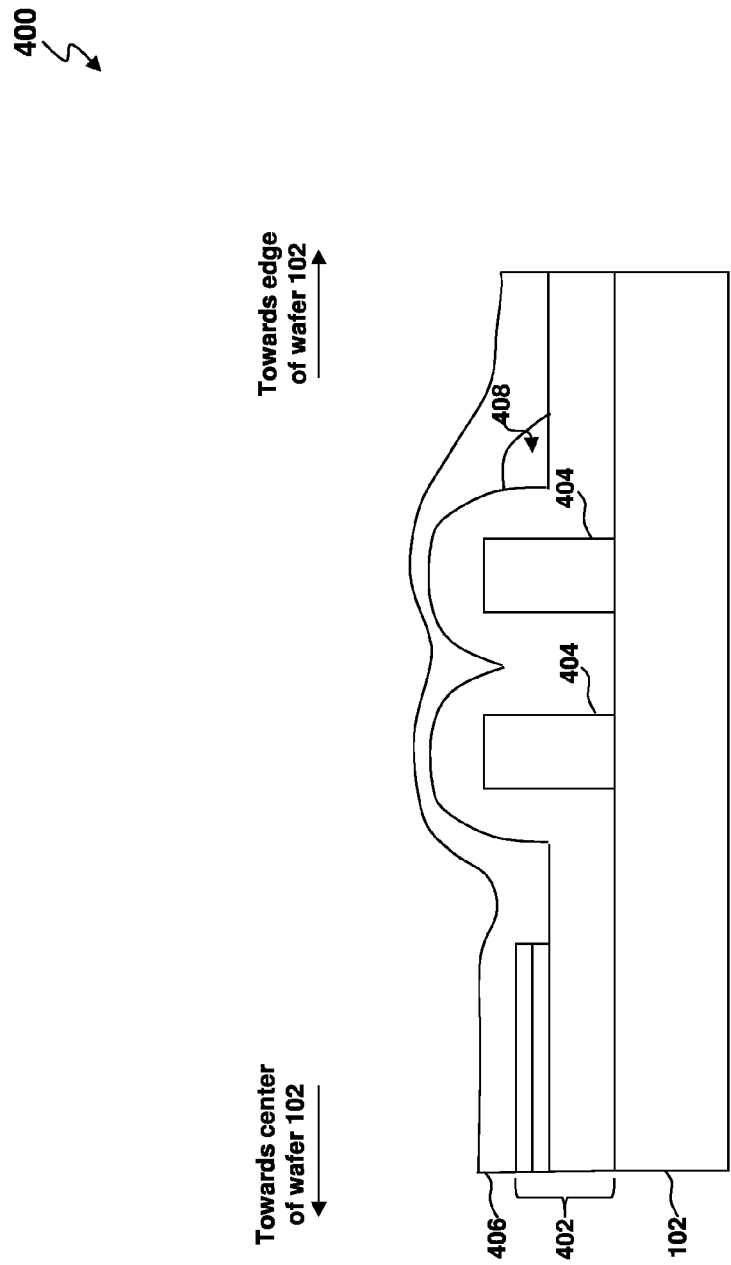
FIG. 4 illustrates a diagrammatic cross-sectional side view of one embodiment of a semiconductor device at a stage of fabrication, according to the method of FIG. 2.

FIG. 4 illustrates a diagrammatic cross-sectional side view of one embodiment of a semiconductor device at a stage of fabrication, according to the method of FIG. 2. With reference to FIG. 4, illustrated is a portion of a cross sectional area of the wafer 102 of FIG. 1 including an exemplary device 400 that has been processed according to the method 200 of FIG. 2. The device 400 includes different layers 402 and structures 404 formed on the wafer 102 that have varying and/or high topography profiles. Because of varying or high topography profiles of the structures 404 of device 400, the pre-wet material is prohibited from adequately coating the top surface/sidewall of structure 404 of device 400. As a result of the inadequately coated surface/sidewall, the photoresist material (or BARC) 406 does not properly coat the device 400, resulting in a micro-bubble 408 along the sidewall of the structure 404 of device 400 that faces away from the center of the wafer 102. Because the micro-bubble is present, defects are printed on the wafer surface after an etch process using the photoresist 406. As such, although method 200 of FIG. 2 provides advantages of reducing photoresist consumption by using the pre-wet material, defects result in the final device from micro-bubbles. In certain embodiments, where structures that have high topography profiles are relatively close, a bubble may also be formed between the two structures 404.

Figure 5:
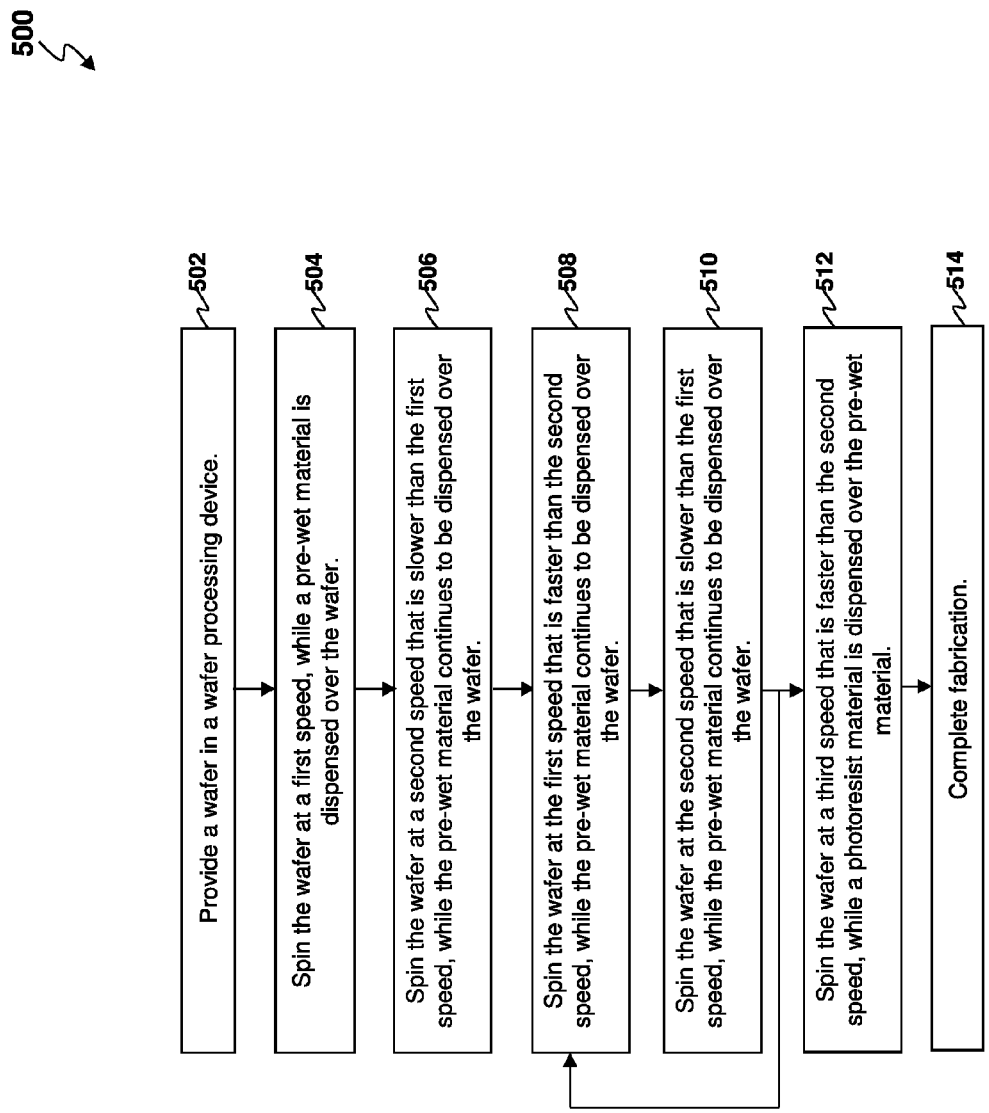
FIG. 5 is a flowchart illustrating a method of fabricating a semiconductor device according to various aspects of the present disclosure.

With reference to FIG. 5 a method 500 of fabricating a semiconductor device according to various aspects of the present disclosure is described below. In the present embodiment, the method 500 is for forming various layers when manufacturing an integrated circuit device. The method 500 begins at block 502 where a wafer is provided in a wafer processing device. At block 504, the wafer is spun at a first speed, while a pre-wet material, such as a reducing resist consumption (RRC) material is dispensed over the wafer. The method continues with block 506 where the wafer is spun at a second speed slower than the first speed, while the pre-wet material continues to be dispensed over the wafer. As the wafer is spun at the slower speed, the pre-wet material is allowed to settle. At block 508 the wafer is once again spun at the first speed that is faster than the second speed, while the pre-wet material continues to be dispensed over the wafer. At block 510, the wafer is once again spun at a second speed slower than the first speed, while the pre-wet material continues to be dispensed over the wafer. As the wafer is spun at the slower speed, the pre-wet material is allowed to settle and permeate air pockets/voids along varying or high topography profiles of the different devices such that the occurrence of micro-bubbles is minimized. Depending on design requirements, the method may repeat blocks 508 and 510 (multi-loop) to achieve a desired result. For example, the method may be repeated based upon the size of the wafer (e.g., 300 mm wafer may require fewer repetitions while larger wafers, such as 450 mm wafers, require more repetitions or may be repeated based upon the desired level of coating such that the occurrence of micro-bubbles is minimized. The method continues with block 512 where the wafer is spun at a third speed that is faster than the second speed, while a photoresist material (and/or BARC) is dispensed over the pre-wet material. The method 500 continues with block 514 where fabrication of the integrated circuit device is completed. Additional steps can be provided before, during, and after the method 500, and some of the steps described can be replaced or eliminated for other embodiments of the method.

Figure 6:
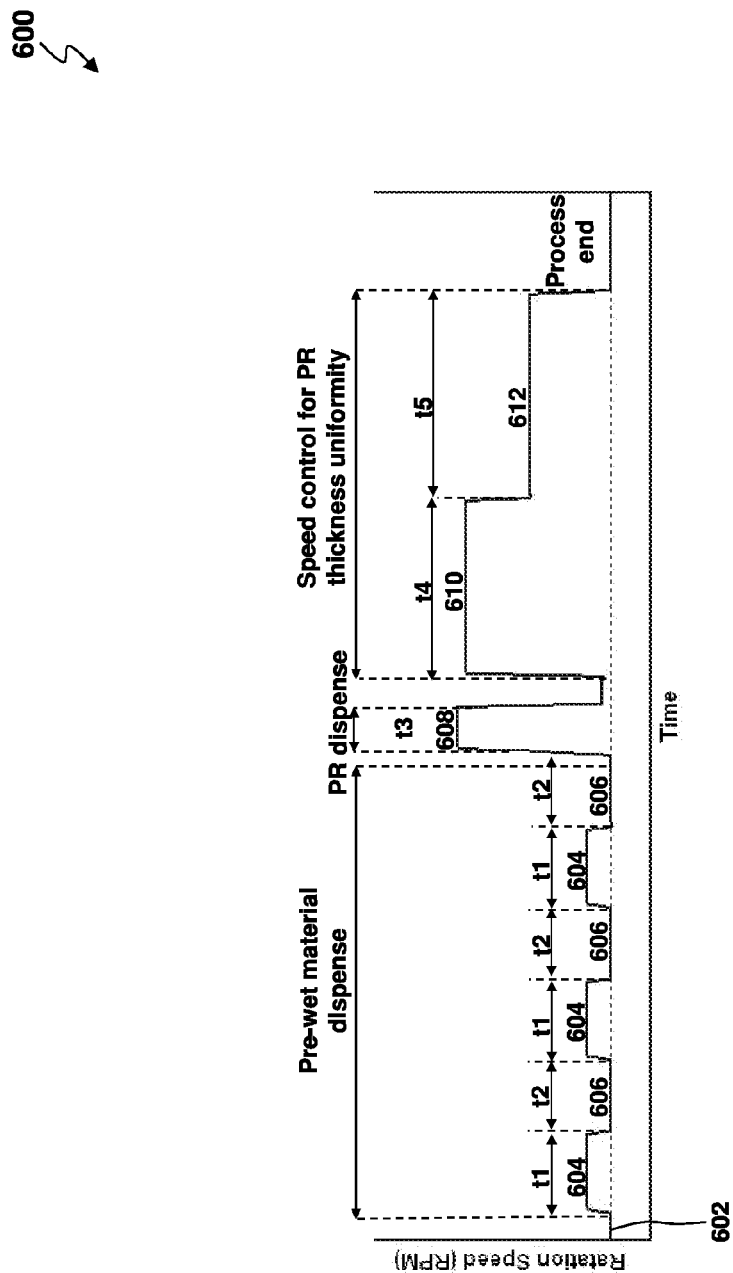
FIG. 6 illustrates a wafer processing timing diagram according to the method of FIG. 5.

FIG. 6 illustrates a wafer processing timing diagram 600 according to method 500 of FIG. 5. Referring to FIG. 6, line 602 illustrates the angular rotation speed of a wafer being processed in a wafer processing device (e.g., device of FIG. 1) in terms of revolution per minute (RPM), for explanation purposes. As illustrated by line 602, the wafer is spun to a first angular speed 604 and a pre-wet solution, such as a reducing resist consumption (RRC) material, is dispensed. The first angular speed 604 may be any appropriate angular speed based on design requirements. For example, design requirements may increase or decrease the first angular speed 604 by based on various factors that affect micro-bubble formation, such as pre-wet material viscosity, temperature of the wafer, temperature of the pre-wet material, ambient temperature, and/or the occurrence of micro-bubbles (e.g., by increasing the angular speed, the occurrence of micro-bubbles may be decreased). In the present embodiment, for example, the first angular speed 604 is less than 600 RPMs, and in one example ranges from about 300 to about 600 RPMs. The first angular speed 604 may be maintained for a first period of time t1, which may be any appropriate period of time based on design requirements. In the present embodiment, for example, the first period of time t1 is less than about 2 seconds.

After the wafer has been spun up to the first angular speed 604 and the pre-wet material has been dispensed on the wafer for a first period of time, the wafer speed is reduced to a second angular speed 606. The second angular speed 606 may be any appropriate angular speed based on design requirements. The second angular speed 606 may be selected such that the pre-wet material may settle. In the present embodiment, for example, the second angular speed 606 is about zero. In alternative embodiments, the second angular speed 606 is greater than zero but less than the first angular speed 604. For example, the second angular speed 606 may be less than about 100 RPMs. In another example, the second angular speed 606 may range from about 0 RPMs to about 20 RPMs. The second angular speed 606 is maintained for a second period of time t2 such that the pre-wet material is allowed to settle and permeate air voids or air pockets on a surface of the wafer such that micro-bubbles which would otherwise result are minimized. A multi-loop sequence including two or more sequences of accelerating the wafer to the first angular speed 604 and maintaining the first angular speed 604 for a first period of time t1 while the pre-wet material is dispensed, and thereafter decelerating the wafer to the second angular speed 606 and maintaining the second angular speed 606 for a second period of time t2 while the pre-wet material is dispensed may be performed, according to design requirements. As illustrated, in the present embodiment, three such sequences are performed.

Still referring to FIG. 6, after the pre-wet material has been dispensed, the wafer is accelerated to a third angular speed 608 for a third period of time t3 and a photoresist material is dispensed over the pre-wet material. Thereafter, the speed of the wafer, as illustrated by line 602, is modulated according to a predetermined speed profile to thereby control the thickness uniformity of the photoresist across the surface of the wafer. In the present embodiment, for example, the predetermined profile includes two different angular speeds/period of times (i.e., fourth angular speed 610 for a fourth period of time t4 and fifth angular speed 612 for a fifth period of time t5). The angular speeds 610, 612 may be any appropriate speed according to design requirements. The periods of time t4, t5 may be any appropriate speed according to design requirements. For example, in the present embodiment, the angular speeds 610, 612 are less than 1200, 600 RPMs, respectively, and the period of time t4, t5 are less than 20 seconds each. As another example, the angular speeds 610, 612 are less than 2000, 1000 RPMs, respectively, and the period of time t4, t5 are less than 60 seconds each. In alternative embodiments, the predetermined profile may include more than two different angular speeds with each angular speed being maintained for different or same periods of time. In alternative embodiments, prior to dispensing the photoresist material, a BARC material is dispensed after which the photoresist material is dispensed over the BARC material.

The above method 500 provides for forming a photoresist layer that has minimized micro-bubble occurrence, thereby reducing manufacturing cost, increasing wafer throughput, and improving device reliability when compared with traditional manufacturing processes. For example, because the wafer rotation sequence during pre-wet dispense is multi-loop, the added acceleration and deceleration sequences assist the pre-wet material in settling and permeating the air pockets/voids on the surface of the wafer. Specifically, the multi-loop sequence assists the pre-wet to permeate air pockets/voids at sidewalls facing away from the center of the wafer and vertical air pockets/voids where narrow openings are present. As a result of permeating the air pockets/voids, micro-bubble defects are minimized thereby reducing device manufacturing cost due to less defects and improving device reliability. Further, because the multi-loop sequence of dispensing the pre-wet material can be accomplished with less pre-wet material and in less time, the cost for pre-wet material is minimized and wafer through put is increased. Different embodiments may have different advantages, and no particular advantage is necessarily required of any embodiment.

Figure 7:
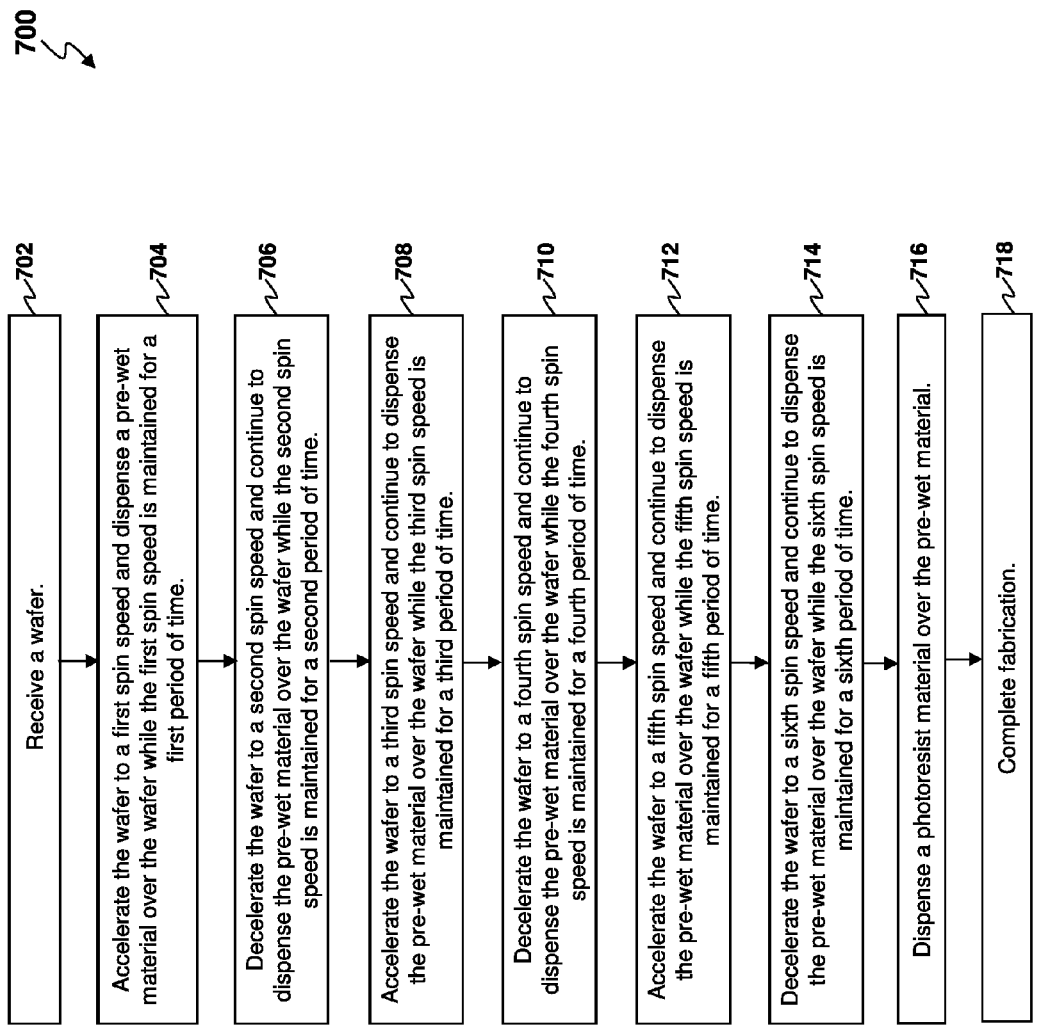
FIG. 7 is a flowchart illustrating a method of fabricating a semiconductor device according to various aspects of the present disclosure.

With reference to FIG. 7 a method 700 of fabricating a semiconductor device according to various aspects of the present disclosure is described below. In the present embodiment, the method 700 is for forming various layers when manufacturing an integrated circuit device. The method 700 begins at block 702 where a wafer is received. At block 704 the wafer is accelerated to a first spin speed and a pre-wet material is dispensed over the wafer while the first spin speed is maintained for a first period of time. The method continues at block 706 where the wafer is decelerated to a second spin speed and the pre-wet material continues to be dispensed over the wafer while the second spin speed is maintained for a second period of time. At block 708 the wafer is accelerated to a third spin speed and the pre-wet material continues to be dispensed over the wafer while the third spin speed is maintained for a third period of time. At block 710 the wafer is decelerated to a fourth spin speed and the pre-wet material continues to be dispensed over the wafer while the fourth spin speed is maintained for a fourth period of time. The method continues at block 712 where the wafer is accelerated to a fifth spin speed and the pre-wet material continues to be dispensed over the wafer while the fifth spin speed is maintained for a fifth period of time. At block 714 the wafer is decelerated to a sixth spin speed and the pre-wet material continues to be dispensed over the wafer while the sixth spin speed is maintained for a sixth period of time. At block 716 a photoresist material is deposited over the pre-wet material. The method continues at block 718 where fabrication is completed. It is understood that each of the spin speeds (i.e., first to sixth spin speeds) may be the same or may be different, depending on design requirements. Further it is understood that each of the periods of time (i.e., first to sixth period of time) may be the same or may be different, depending on design requirements. Additional steps can be provided before, during, and after the method 200, and some of the steps described can be replaced or eliminated for other embodiments of the method.

Figure 8:
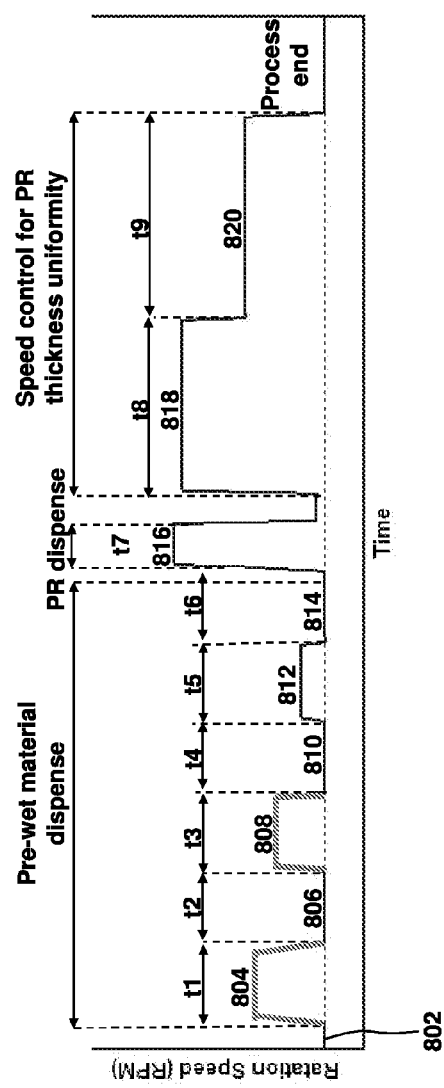
FIG. 8 illustrates a wafer processing timing diagram according to the method of FIG. 7.

FIG. 8 illustrates a wafer processing timing diagram 800 according to method 700 of FIG. 7. Referring to FIG. 8, line 802 illustrates the angular rotation speed of a wafer being processed in a wafer processing device (e.g., device of FIG. 1) in terms of revolution per minute (RPM), for explanation purposes. As illustrated by line 802, the wafer is accelerated to a first angular speed 804 and a pre-wet solution, such as a reducing resist consumption (RRC) material, is dispensed. The first angular speed 804 may be any appropriate angular speed based on design requirements. For example, design requirements may increase or decrease the first angular speed 804 by based on various factors that affect micro-bubble formation, such as pre-wet material viscosity, temperature of the wafer, temperature of the pre-wet material, ambient temperature, and/or the occurrence of micro-bubbles (e.g., by increasing the angular speed, the occurrence of micro-bubbles may be decreased). In the present embodiment, for example, the first angular speed 804 ranges from about 300 to about 600 RPMs. The first angular speed 804 may be maintained for a first period of time t1, which may be any appropriate period of time based on design requirements. In the present embodiment, for example, the first period of time t1 is less than about 2 seconds.

After the wafer has been accelerated to the first angular speed 804 and the pre-wet material has been dispensed on the wafer for a first period of time t1, the wafer is decelerated to a second angular speed 806. The second angular speed 806 may be any appropriate angular speed based on design requirements. The second angular speed 806 may be selected such that the pre-wet material may settle. In the present embodiment, for example, the second angular speed 806 is about zero. In alternative embodiments, the second angular speed 806 is greater than zero but less than the first angular speed 804. For example, the second angular speed 806 may be less than about 100 RPMs. In another example, the second angular speed 806 may range from about 0 RPMs to about 20 RPMs. The second angular speed 806 is maintained for a second period of time t2 such that the pre-wet material is allowed to settle and permeate voids or air pockets on a surface of the wafer such that micro-bubbles which would otherwise result are minimized.

A multi-loop sequence including two or more sequences of accelerating the wafer to a high angular speed and decelerating the wafer to a low angular speed for various periods of while the pre-wet material is dispensed may be performed, according to design requirements. As illustrated, in the present embodiment, three such sequences are performed. For example, in the present embodiment, third angular speed 808 is reached and maintained for a third period of time t3, fourth angular speed 810 is reached and maintained for a fourth period of time t4, fifth angular speed 812 is reached and maintained for a fifth period of time t5, and sixth angular speed t6 is reached and maintained for a sixth period of time t6. In the present embodiment, the third angular speed 808 is less than the first angular speed 804 and greater than the second angular speed 806, the fourth angular speed 810 is less than the third angular speed 808 and may be the same, less than, or greater than the second angular speed 806, the fifth angular speed 812 is less than the third angular speed 808 and greater than the fourth angular speed 810, and the sixth angular speed 814 is less than the fifth angular speed 812 and may be the same, less than, or greater than the second and fourth angular speeds 806, 810. The periods of time (t1-t6) may be the same or different. For example, if different, the periods of time (t1, t3, and t5) where there is relatively high angular speeds may have the same period of time (e.g., less than 2 seconds) and the periods of time (t2, t4, and t6) where there is relatively low angular speed may have the same period of time (e.g., less than 1 second). In another example, if different, the period of time decreases per cycle (e.g., t1>t2>t3>t4>t5>t6). It is understood that the period of time may be any appropriate time period such that the bubbles are minimized during periods of high angular speed and such that the pre-wet material may settle and permeate the wafer surface during periods of low angular speed.

Still referring to FIG. 8, after the pre-wet material has been dispensed, the wafer is accelerated to a seventh angular speed 816 for a seventh period of time t7 and a photoresist material is dispensed over the pre-wet material. Thereafter, the speed of the wafer, as illustrated by line 802, is modulated according to a predetermined speed profile to thereby control the thickness uniformity of the photoresist across the surface of the wafer. In the present embodiment, for example, the predetermined profile includes two different angular speeds/period of times (i.e., eight angular speed 818 for a eight period of time t8 and ninth angular speed 820 for a ninth period of time t9). The angular speeds 818, 820 may be any appropriate speed according to design requirements. The periods of time t8, t9 may be any appropriate speed according to design requirements. For example, in the present embodiment, the angular speeds 818, 820 are less than 1200, 600 RPMs, respectively, and the period of time t8, t9 are less than 20 seconds each. As another example, the angular speeds 818, 820 are less than 2000, 1000 RPMs, respectively, and the period of time t4, t5 are less than 60 seconds each. In alternative embodiments, the predetermined profile may include more than two different angular speeds with each angular speed being maintained for different or same periods of time. In alternative embodiments, prior to dispensing the photoresist material, a BARC material is dispensed after which the photoresist material is dispensed over the BARC material.

The above method 700 provides for forming a photoresist layer that has minimized micro-bubble occurrence, thereby reducing manufacturing cost, increasing wafer throughput, and improving device reliability when compared with traditional manufacturing processes. For example, because the wafer rotation sequence during pre-wet dispense is multi-loop, the added acceleration and deceleration sequences assist the pre-wet material in settling and permeating air pockets/voids on the surface of the wafer. Specifically, the multi-loop sequence assists the pre-wet to permeate air pockets/voids at sidewalls facing away from the center of the wafer and vertical air pockets/voids where narrow openings are present between two structures. As a result of permeating the air pockets/voids, micro-bubble defects are minimized thereby reducing device manufacturing cost and improving device reliability. Further, because the multi-loop sequence of dispensing the pre-wet material can be accomplished with less pre-wet material and in less time when compared to traditional methods, the cost for pre-wet material is minimized and wafer through put is increased. Different embodiments may have different advantages, and no particular advantage is necessarily required of any embodiment.

Thus, provided is a method. The exemplary includes providing a wafer. The method further includes spinning the wafer during a first cycle at a first speed, while a pre-wet material is dispensed over the wafer and spinning the wafer during the first cycle at a second speed, while the pre-wet material continues to be dispensed over the wafer. The method further includes spinning the wafer during a second cycle at the first speed, while the pre-wet material continues to be dispensed over the wafer and spinning the wafer during the second cycle at the second speed, while the pre-wet material continues to be dispensed over the wafer. The method further includes spinning the wafer at a third speed, while a photoresist material is dispensed over the wafer including the pre-wet material.

In some embodiments, the method further comprises after spinning the wafer at the third speed, spinning the wafer according to a predetermined speed profile to thereby control a thickness uniformity of the photoresist across the wafer. In various embodiments, the method further comprises before spinning the wafer at the third speed, spinning the wafer during a third cycle at the first speed, while the pre-wet material continues to be dispensed over the wafer; and spinning the wafer during the third cycle at the second speed, while the pre-wet material continues to be dispensed over the wafer.

In some embodiments, the pre-wet material is a resist reducing consumption (RRC) material. In various embodiments, the RRC material includes propylene glycol methyl ether acetate (PGMEA). In certain embodiments, the first speed is greater than the second speed, and the third speed is greater than the first speed. In further embodiments, the first speed is less than about 600 RPMs, and the second speed is less than about 100 RPMs. In some embodiments, the first speed is maintained for a first period of time, the second speed is maintained for a second period of time, and the first period of time is greater than the second period of time.

Also provided is an alternative embodiment of a method. The method includes receiving a wafer. The method further includes accelerating the wafer to a first spin speed and dispensing a pre-wet material over the wafer while the first spin speed is maintained for a first period of time and decelerating the wafer from the first spin speed to a second spin speed and continuing to dispense the pre-wet material over the wafer while the second spin speed is maintained for a second period of time. The method further includes accelerating the wafer from the second spin speed to a third spin speed and continuing to dispense the pre-wet material over the wafer while the third spin speed is maintained for a third period of time and decelerating the wafer from the third spin speed to a fourth spin speed and continuing to dispense the pre-wet material over the wafer while the third spin speed is maintained for a fourth period of time. The method further includes accelerating the wafer to another spin speed and dispensing a photoresist material over the wafer including the pre-wet material.

In some embodiments, the method further includes before accelerating the wafer to the another spin speed, accelerating the wafer from the fourth spin speed to a fifth spin speed and continuing to dispense the pre-wet material over the wafer while the fifth spin speed is maintained for a fifth period of time; and decelerating the wafer from the fifth spin speed to a sixth spin speed and continuing to dispense the pre-wet material over the wafer while the sixth spin speed is maintained for a sixth period of time. In various embodiments, the method further includes before dispensing the photoresist material over the wafer including the pre-wet material, dispensing a bottom antireflective coating (BARC) material over the wafer including the pre-wet material. In certain embodiments, the method further includes stopping the dispensing of the photoresist material; and after stopping the dispensing of the photoresist material, accelerating and decelerating the wafer according to a predetermined speed profile to thereby control a thickness uniformity of the photoresist across the wafer.

In some embodiments, the first, third, and fifth spin speeds are substantially the same, the second, fourth, and sixth spin speeds are substantially the same, the first, third, and fifth periods of time are substantially the same, and the second, fourth, and sixth periods of time are substantially the same. In various embodiments, the first, third, and fifth spin speeds are different, the second, fourth, and sixth spin speeds are different, the first, third, and fifth periods of time are different, and the second, fourth, and sixth periods of time are different. In further embodiments, the first spin speed ranges from about 300 RPMs to about 600 RPMs, and the second spin speed ranges from about 0 RPMs to about 20 RPMs. In some embodiments, the first period of time is less than about 2 seconds, and the second period of time is less than about 1 second.

Also provided is an alternative embodiment of a method. The method includes receiving a wafer in a wafer processing device and coating the wafer with a pre-wet material as a multi-loop process is performed on the wafer in the wafer processing device. The multi-loop process includes: accelerating the wafer to a first spin speed and maintaining the first spin speed for a first period of time; decelerating the wafer from the first spin speed to a second spin speed and maintaining the second spin speed for a second period of time; accelerating the wafer from the second spin speed to a third spin speed and maintaining the third speed for a third period of time; and decelerating the wafer from the third spin speed to a fourth spin speed and maintaining the fourth spin speed for a fourth period of time.

In some embodiments, the method further includes coating the wafer including the pre-wet material with a photoresist material; and performing a modulation process on the wafer according to a predetermined speed profile to thereby control a thickness uniformity of the photoresist across the wafer. In further embodiments, the method further includes before coating the wafer including the pre-wet material with a photoresist material, coating the wafer including the pre-wet material with a bottom antireflective coating (BARC) material.

In some embodiments, the multi-loop process further includes: accelerating the wafer from the fourth spin speed to a fifth spin speed and maintaining the fifth spin speed for a fifth period of time; and decelerating the wafer from the fifth spin speed to a sixth spin speed and maintaining the sixth spin speed for a sixth period of time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a wafer having a first surface;
dispensing a first material over the first surface of the wafer during a first spin cycle, a second spin cycle after the first spin cycle, and a third spin cycle after the second spin cycle,
wherein the first spin cycle includes spinning the wafer at a first speed for a first period of time and spinning the wafer at a second speed for a second period of time that is after the first period of time, wherein the second speed is less than the first speed,
wherein the second spin cycle includes spinning the wafer at a third speed for a third period of time and spinning the wafer at a fourth speed for a fourth period of time that is after the third period of time, wherein the fourth speed is less than the third speed and the second speed is less than the third speed,
wherein the third spin cycle includes spinning the wafer at a fifth speed for a fifth period of time; and
dispensing a second material over the first surface of the wafer including the first material, during a fourth spin cycle after the first, second, and third spin cycles, wherein the second material is different from the first material.

2. The method of claim 1 wherein the first speed, the third speed and the fifth speed are the same, wherein the second speed and the fourth speed are the same.

3. The method of claim 1 wherein the first period of time, the third period of time and the fifth period of time are the same, wherein the second period of time and the fourth period of time are the same.

4. The method of claim 1 wherein the second speed and the fourth speed are different, wherein the first period of time, the third period of time, and the fifth period of time are different, and wherein the second period of time and the fourth period of time are different.

5. The method of claim 1 wherein the second material is at least one of: a bottom antireflective coating (BARC) material or a photoresist material.

6. The method of claim 1 wherein the first material is a resist reducing consumption (RRC) material.

7. The method of claim 1 wherein the first speed is greater than 300 RPMs, and wherein the second speed is between 0 and 100 RPMs.

8. The method of claim 1, wherein the first surface includes integrated circuit topography.

9. A method comprising:
receiving a wafer;
accelerating the wafer to a first spin speed and dispensing a first material over the wafer while the first spin speed is maintained for a first period of time;
decelerating the wafer from the first spin speed;
accelerating the wafer to a second spin speed and dispensing the first material over the wafer while the second spin speed is maintained for a second period of time;
decelerating the wafer from the second spin speed;
accelerating the wafer to a third spin speed and dispensing the first material over the wafer while the third spin speed is maintained for a third period of time; and
accelerating the wafer to a fourth spin speed and dispensing a second material over the wafer including the first material while the fourth spin speed is maintained for a fourth period of time, wherein the second material is different than the first material.

10. The method of claim 9 wherein the first spin speed, the second spin speed and the third spin speed are the same, wherein the first period of time, the second period of time and the third period of time are the same.

11. The method of claim 9 further comprising:
before dispensing the second material over the wafer including the first material, dispensing a bottom antireflective coating (BARC) material over the wafer including the first material.

12. The method of claim 9 further comprising:
stopping the dispensing of the second material; and
after stopping the dispensing of the second material, accelerating and decelerating the wafer according to a predetermined speed profile to thereby control a thickness uniformity of the second material across the wafer.

13. The method of claim 9 wherein the first spin speed, the second spin speed, and the third spin speed are different, wherein the first period of time, the second period of time and the third period of time are different.

14. The method of claim 9 wherein the second material is at least one of: a bottom antireflective coating (BARC) material or a photoresist material,
wherein the first material is a resist reducing consumption (RRC) material.

15. The method of claim 13 wherein the first spin speed ranges from about 300 RPMs to about 600 RPMs, and
wherein the wafer is decelerated from the first spin speed to a spin speed that ranges from about 0 RPMs to about 20 RPMs.

16. The method of claim 13 wherein the first period of time is less than 2 seconds, wherein the second period of time is less than the first period of time, wherein the third period of time is less than the second period of time.

17. A method comprising:
coating a wafer with a first material while a multi-loop process is performed on the wafer in a wafer processing device, wherein the multi-loop process includes:
accelerating the wafer to a first spin speed;
maintaining the first spin speed for a first period of time;
decelerating the wafer from the first spin speed to a second spin speed; maintaining the second spin speed for a second period of time;
accelerating the wafer from the second spin speed to a third spin speed;
maintaining the third spin speed for a third period of time;
decelerating the wafer from the third spin speed to a fourth spin speed;
maintaining the fourth spin speed for a fourth period of time;
accelerating the wafer from the fourth spin speed to a fifth spin speed;
maintaining the fifth spin speed for a fifth period of time; and
after the multi-loop process, accelerating the wafer to another spin speed; and dispensing a second material over the wafer, wherein the wafer includes the first material.

18. The method of claim 17 wherein the first period of time is greater than the second period of time, wherein the second period of time is greater than the third period of time, wherein the third period of time is greater than the fourth period of time, wherein the fourth period of time is greater than the fifth period of time.

19. The method of claim 17 further comprising:
performing a modulation process on the wafer according to a predetermined speed profile to thereby control a thickness uniformity of the second material across the wafer.

20. The method of claim 19 further comprising:
before coating the wafer including the first material with the second material, coating the wafer including the first material with a bottom antireflective coating (BARC) material.

* * * * *